(12) United States Patent
Nilsson et al.

(10) Patent No.: US 11,527,347 B2
(45) Date of Patent: *Dec. 13, 2022

(54) TUNABLE INDUCTOR ARRANGEMENT, TRANSCEIVER, METHOD AND COMPUTER PROGRAM

(71) Applicant: Telefonaktiebolaget LM Ericsson (publ), Stockholm (SE)

(72) Inventors: Magnus Nilsson, Lund (SE); Magnus Sandgren, Staffanstorp (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 11 days.

This patent is subject to a terminal disclaimer.

(21) Appl. No.: 17/118,212

(22) Filed: Dec. 10, 2020

(65) Prior Publication Data

US 2021/0098169 A1 Apr. 1, 2021

Related U.S. Application Data

(63) Continuation of application No. 16/360,414, filed on Mar. 21, 2019, now Pat. No. 10,892,080, which is a
(Continued)

(30) Foreign Application Priority Data

Oct. 16, 2013 (EP) ..................................... 13188910

(51) Int. Cl.
*H04B 1/40* (2015.01)
*H01F 21/12* (2006.01)
(Continued)

(52) U.S. Cl.
CPC ......... *H01F 21/12* (2013.01); *H01L 23/5227* (2013.01); *H03J 3/20* (2013.01);
(Continued)

(58) Field of Classification Search
CPC ........ H03J 5/24; H03J 3/20; H03J 5/00; H03J 3/00; H03J 3/18; H03J 1/00; H03J 3/04;
(Continued)

(56) References Cited

U.S. PATENT DOCUMENTS 5,072,722 A 12/1991 Fockens
5,351,688 A 10/1994 Jones
(Continued)

FOREIGN PATENT DOCUMENTS

CN 1613175 A 5/2005
CN 1950913 A 4/2007
(Continued)

OTHER PUBLICATIONS

3Gpp, "3rd Generation Partnership Project; Technical Specification Group Radio Access Network; Evolved Universal Terrestrial Radio Access (E-UTRA); User Equipment (UE) radio transmission and reception (Release 11)", 3GPP TS 36.101 V11.1.0, Jun. 2012, pp. 1-336.
(Continued)

*Primary Examiner* — Tu X Nguyen
(74) *Attorney, Agent, or Firm* — Murphy, Bilak & Homiller, PLLC

(57) ABSTRACT

A tunable inductor arrangeable on a chip or substrate comprises a first winding part connected at one end to a first input of the tunable inductor arrangement, a second winding part connected at one end to the other end of the first winding part, a third winding part connected at one end to a second input of the tunable inductor arrangement, a fourth winding part connected at one end to the other end of the third winding part, and a switch arrangement arranged. The switch arrangement tunes the tunable inductor by selectively connecting the first and fourth winding parts in parallel and the second and third winding parts in parallel, with the
(Continued)

parallel couplings in series between the first and second inputs, or connecting the first, second, fourth and third winding parts in series between the first and second inputs. Corresponding transceivers, communication devices, methods and computer programs are disclosed.

10 Claims, 3 Drawing Sheets

Related U.S. Application Data continuation of application No. 15/872,184, filed on Jan. 16, 2018, now Pat. No. 10,283,252, which is a continuation of application No. 15/029,284, filed as application No. PCT/EP2014/071750 on Oct. 10, 2014, now Pat. No. 9,905,350.

(51) Int. Cl.
  *H01L 23/522* (2006.01)
  *H03J 5/02* (2006.01)
  *H03J 3/20* (2006.01)
  *H03J 5/24* (2006.01)

(52) U.S. Cl.
  CPC ............ *H03J 5/02* (2013.01); *H03J 5/246* (2013.01); *H04B 1/40* (2013.01); *H01F 2021/125* (2013.01); *H01L 2924/0002* (2013.01)

(58) Field of Classification Search
  CPC ........ H03J 3/08; H03J 3/10; H03J 5/02; H03J 3/22; H04B 1/04; H04B 1/40; H04B 1/38; H04B 1/02; H04B 1/06; H04B 1/3827; H01Q 11/12; H01Q 9/04
  See application file for complete search history.

(56) References Cited

U.S. PATENT DOCUMENTS

| | | |
|---|---|---|
| 6,621,365 B1 | 9/2003 | Hallivuori et al. |
| 7,005,930 B1 | 2/2006 | Kim et al. |
| 7,151,430 B2 | 12/2006 | Mattsson |
| 7,432,794 B2 | 10/2008 | Mattsson |
| 8,183,971 B2 | 5/2012 | Le Guillou et al. |
| 8,331,978 B2 | 12/2012 | Cabanillas et al. |
| 8,995,935 B2 | 3/2015 | Mihota |
| 9,299,764 B2 | 3/2016 | Mattsson et al. |
| 10,121,845 B2 | 11/2018 | Mattsson et al. |
| 2005/0052272 A1 | 3/2005 | Tiebout et al. |
| 2005/0195063 A1 | 9/2005 | Mattsson |
| 2005/0237772 A1 | 10/2005 | Batarseh et al. |
| 2009/0085689 A1 | 4/2009 | Rohani et al. |
| 2009/0134954 A1 | 5/2009 | Uzunov et al. |
| 2009/0167466 A1 | 7/2009 | Qiu et al. |
| 2010/0148882 A1 | 6/2010 | Bouttement et al. |
| 2010/0164667 A1 | 7/2010 | Ho-Hsiang |
| 2010/0171557 A1 | 7/2010 | Tsukizawa |
| 2011/0006872 A1 | 1/2011 | Nazarian et al. |
| 2011/0148536 A1 | 6/2011 | Italia et al. |
| 2012/0028688 A1 | 2/2012 | Vartanian |
| 2012/0244802 A1 | 9/2012 | Feng et al. |
| 2012/0249384 A1 | 10/2012 | Kaikkonen et al. |
| 2012/0286889 A1 | 11/2012 | Park et al. |
| 2012/0302188 A1 | 11/2012 | Sahota et al. |
| 2013/0051493 A1 | 2/2013 | Mo et al. |
| 2013/0141177 A1 | 6/2013 | Narathong et al. |
| 2013/0165058 A1 | 6/2013 | Mostafa et al. |
| 2015/0002236 A1 | 1/2015 | Wang et al. |
| 2015/0234422 A1 | 8/2015 | Bucelot et al. |

FOREIGN PATENT DOCUMENTS

| | | |
|---|---|---|
| CN | 101057391 A | 10/2007 |
| CN | 101253585 A | 8/2008 |
| CN | 101682293 A | 3/2010 |
| CN | 103227647 A | 7/2013 |
| EP | 2110821 A2 | 10/2009 |
| EP | 2863428 B1 | 5/2017 |
| EP | 2863429 B1 | 6/2017 |
| JP | 2009500860 A | 1/2009 |
| RU | 92273 U1 | 3/2010 |
| RU | 2012122227 A | 12/2013 |
| RU | 2517059 C2 | 5/2014 |
| WO | 03038999 A1 | 5/2003 |
| WO | 03052780 A1 | 6/2003 |
| WO | 2007006867 A1 | 1/2007 |
| WO | 2009081342 A1 | 7/2009 |

OTHER PUBLICATIONS

Deng, Wei, et al., "A 25MHz-6.44GHz LC-VCO Using a 5-port Inductor for multi-band Frequency Generation", Department of Physical Electronics, Tokyo Institute of Technology, Tokyo, Japan, 2011, 4 pages.

Tesson, O, "High Quality Monolithic 8-shaped Inductors for Silicon RF IC Design", IEEE, NXP Semiconductors, Campus EffiScience, Colombelles, France, 2008, 4 pages.

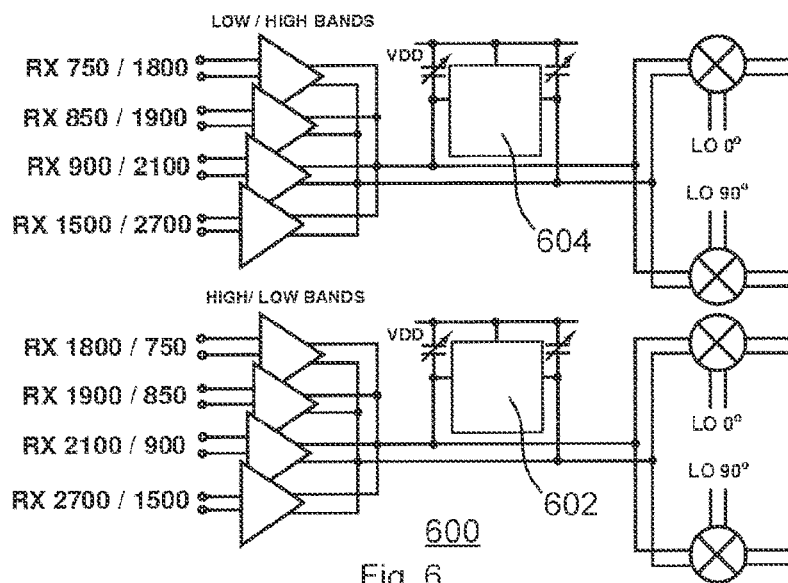
Fig. 6
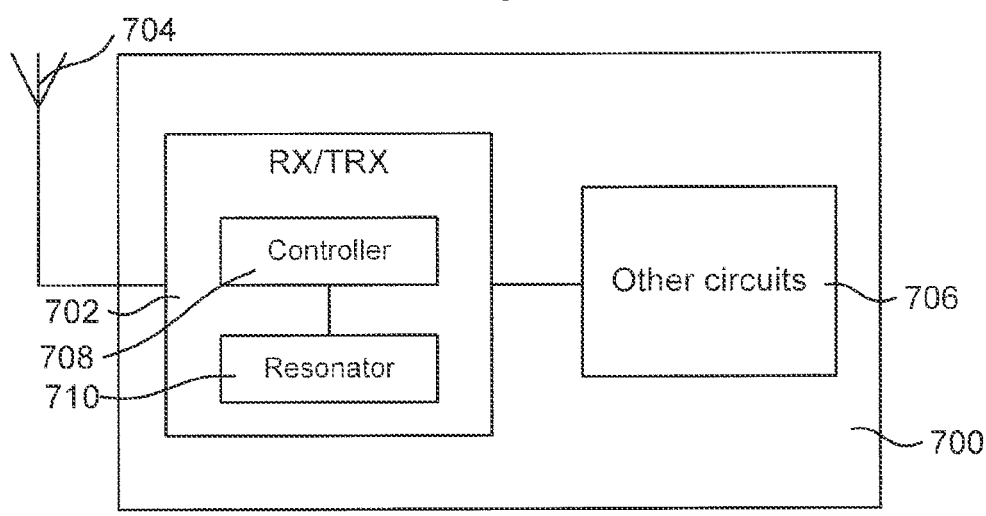
Fig. 7
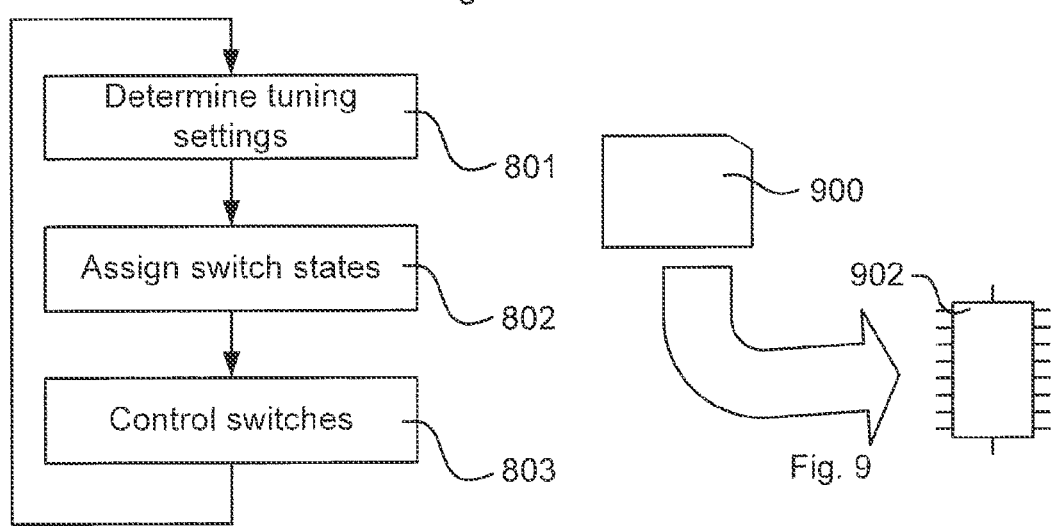
Fig. 8
Fig. 9

TUNABLE INDUCTOR ARRANGEMENT, TRANSCEIVER, METHOD AND COMPUTER PROGRAM

RELATED APPLICATIONS

This application is a continuation of U.S. application Ser. No. 16/360,414 filed 21 Mar. 2019, which is a continuation of U.S. application Ser. No. 15/872,184 filed 16 Jan. 2018, now U.S. Pat. No. 10,283,252, which is a continuation of U.S. application Ser. No. 15/029,284 filed 14 Apr. 2016, now U.S. Pat. No. 9,905,350, which is a National Phase application of PCT/EP2014/071750 filed 10 Oct. 2014, which claims priority from EP13188910.7 filed 16 Oct. 2013. The entire contents of each aforementioned application is incorporated herein by reference.

TECHNICAL FIELD

The present invention generally relates to a tunable inductor arrangement, a radio frequency transceiver or receiver with a resonator having such an arrangement, a communication device, a method of tuning the arrangement and a computer program for tuning.

BACKGROUND

As more bands are to be supported in radio transceivers, which bands may span over a wide frequency range such as from 600 MHz to 3800 MHz, this can be met by a set of resonators. It is known that tuning an LC (inductor-capacitor) resonator more than one octave is difficult, which gives that a multitude of resonators may be demanded. This problem is further emphasized when carrier aggregation, i.e., the communication is performed on several different carriers simultaneously, which carriers may be spread anywhere in the wide frequency range.

LC resonators consume chip space, when implemented on-chip, and are fairly costly when implemented off-chip. It is, therefore, a desire to provide more flexible resonators.

SUMMARY

An object of the invention is to at least alleviate the above-stated problem. The present invention is based on the understanding that both capacitance and inductance of an LC resonator need to be tuned to achieve the desired flexibility. A tunable inductor arrangement is provided accordingly. The inventor has also realized the demands that the self-resonant frequency needs to be set high enough for high-frequency modes, the Q-value has to be high enough not to degrade gain or increase current consumption in a usable implementation, and that the ratio of the inductances needs to be high enough to also cover the low bands. This is achieved by a switch arrangement in the tunable inductor arrangement which performs signal routing such that insertion loss is decreased.

According to a first aspect, there is provided a tunable inductor arrangement arrangeable on a chip or substrate. The tunable inductor comprises a first winding part connected at a first end to a first input of the tunable inductor arrangement; a second winding part connected at a first end to a second end of the first winding part; a third winding part connected at a first end to a second input of the tunable inductor arrangement; a fourth winding part connected at a first end to a second end of the third winding part; and a switch arrangement arranged to tune the tunable inductor arrangement by selectively provide any of a circuit comprising the first and fourth winding parts in parallel and the second and third winding parts in parallel, with the parallel couplings connected in series between the first and second inputs; and a circuit comprising the first, second, fourth and third winding parts in series between the first and second inputs.

The switch arrangement may comprise a first switch connected between a second end of the second winding part and a virtual ground; a second switch connected between the second end of the fourth winding part and the virtual ground; a third switch connected between the first end of the second winding part and the virtual ground; a fourth switch connected between the first end of the fourth winding part and the virtual ground; a fifth switch connected between the first input and a second end of the fourth winding part; and a sixth switch connected between the second input and the second end of the second winding part. The tunable inductor arrangement may then be tunable by either closing the third, fourth, fifth and sixth switches and having the first and second switches open, or closing the first and second switches and having the third, fourth, fifth and sixth switches open.

The switch arrangement may comprise a first switch connected between a second end of the second winding part and a second end of the fourth winding part; a second switch connected between the second end of the first winding part and the second end of the third winding part; a third switch connected between the first input and the second end of the fourth winding part; and a fourth switch connected between the second input and the second end of the second winding part. The tunable inductor arrangement may then be tunable by either closing the second, third and fourth switches and having the first switch open, or closing the first switch and having the second, third and fourth switches open.

The first, second, third and fourth winding parts may be interleaved on the chip or substrate such that magnetic fields of the windings are essentially common.

The tunable inductor arrangement may comprise a further winding part wherein the further winding part is arranged to cancel electromagnetic coupling with the first to fourth winding parts.

Two or more of the winding parts may be arranged in a plurality of conductive layers on the chip or substrate.

The virtual ground may be a DC power supply, which at AC, such as radio frequency, acts as a ground for AC signals, or be a ground or DC reference voltage node.

According to a second aspect, there is provided a radio frequency transceiver comprising a resonator, wherein the resonator comprises a tunable inductor arrangement according to the first aspect, wherein the tunable inductor arrangement is tunable to enable the resonator to selectably work at one of a plurality of resonating frequencies.

According to a third aspect, there is provided a multiband radio frequency receiver comprising a first receiver path arranged to receive a radio signal in a first frequency band; a second receiver path arranged to receive a radio signal in a second frequency band, wherein the first frequency band operates at a higher frequency than the second frequency band, and each of the first and second receiver paths is arranged to selectively operate at a selected frequency band among a plurality of frequency bands; and comprises a resonator comprising a tunable inductor arrangement according to the first aspect, which resonator is arranged to be tuned for the selected frequency band.

According to a fourth aspect, there is provided a communication device comprising a radio frequency transceiver according to the second aspect or a multiband radio frequency receiver according to the third aspect, and a processor arranged to interact with the radio frequency transceiver or multiband radio frequency receiver, wherein the processor is arranged to control to the switch arrangement to select a tuning mode of the tunable inductor arrangement.

According to a fifth aspect, there is provided a method of a tunable inductor arrangement including winding parts and switches for tuning according to the first aspect. The method comprises determining a tuning setting for the tunable inductor arrangement; assigning switch states for respective switches for the tuning setting; and controlling the switches according to the assigned switch states.

According to a sixth aspect, there is provided a computer program comprising computer executable instructions which when executed by a programmable controller of a radio frequency transceiver or multiband radio frequency receiver comprising a resonator which comprises a tunable inductor arrangement causes the controller to perform the method of the fifth aspect.

Other objectives, features, and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of said element, device, component, means, step, etc., unless explicitly stated otherwise. The steps of any method disclosed herein do not have to be performed in the exact order disclosed unless explicitly stated.

BRIEF DESCRIPTION OF THE DRAWINGS

The above, as well as additional objects, features, and advantages of the present invention, will be better understood through the following illustrative and non-limiting detailed description of preferred embodiments of the present invention, with reference to the appended drawings.

FIG. 6 schematically illustrates a radio front end where the tunable inductor arrangements according to embodiments are applicable.

FIG. 7 is a block diagram schematically illustrating a communication device according to an embodiment.

FIG. 8 is a flow chart schematically illustrating a method of a tunable inductor arrangement according to an embodiment.

FIG. 9 schematically illustrates a computer program and a processor for implementing the method.

DETAILED DESCRIPTION

Figure 1:
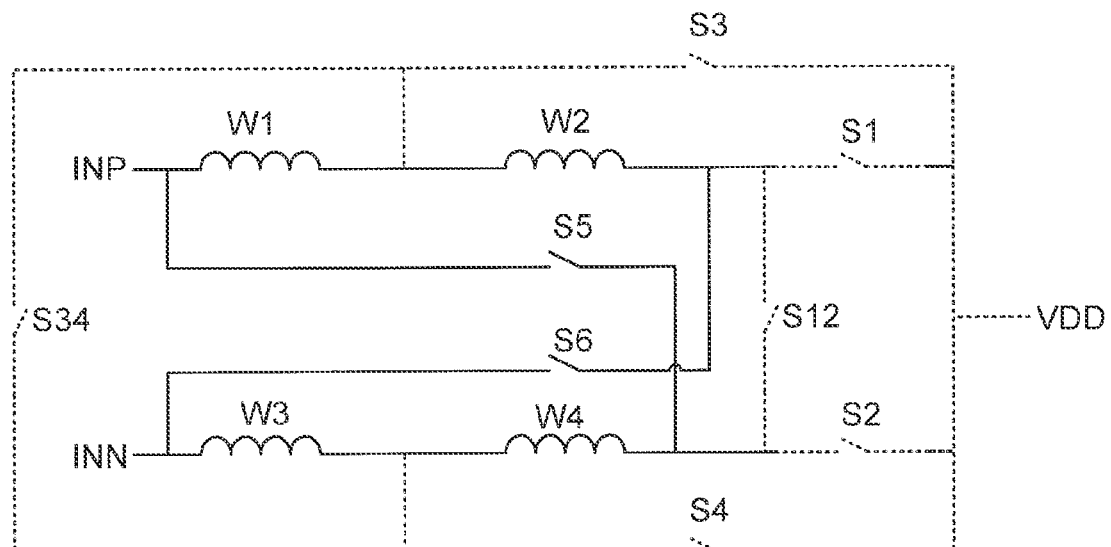
FIG. 1 schematically illustrates a tunable inductor arrangement according to an embodiment.

FIG. 1 schematically illustrates a tunable inductor arrangement according to an embodiment. The inductor arrangement is preferably arranged on a chip or substrate, as will be demonstrated below. The tunable inductor arrangement comprises a first winding part W1 connected at one end to a first input INP of the tunable inductor arrangement, a second winding part W2 connected at one end to the other end of the first winding part W1, a third winding part W3 connected at one end to a second input INN of the tunable inductor arrangement and a fourth winding part W4 connected at one end to the other end of the third winding part. A switch arrangement is arranged to tune the tunable inductor arrangement by selectively provide for that a circuit comprising the first and fourth winding parts W1, W4 in parallel and the second and third winding part W2, W3 in parallel, and then couple the respective parallel couplings W1, W4; W2, W3 in series between the first and second inputs INP, INN, or a circuit comprising the first, second, fourth and third winding parts W1, W2, W4, W3 in series between the first and second inputs INP, INN. The switch arrangement comprises a first switch S1 connected between the other end of the second winding part W2 and a virtual ground VDD, a second switch S2 connected between the other end of the fourth winding part W4 and the virtual ground VDD. The virtual ground may be a DC power supply, thus here named VDD, which at AC, such as radio frequency, acts as a ground for AC signals, or be a ground or DC reference voltage node. If the center tap is not used, the first and second switches can be substituted by a single switch S12 providing the same function as the first and second switches S1, S2. The switch arrangement further comprises a third switch S3 connected between the other end of the first winding part W1 and the virtual ground VDD, and a fourth switch S4 connected between the other end of the third winding part W3 and the virtual ground VDD. Similar, when the center tap is not used, the third and fourth switches can be substituted by a single switch S34 providing the same function as the third and fourth switches S3, S4. The tunable inductor arrangement is thereby tunable by either closing the first and second switches S1, S2 (or the single switch S12) such that a circuit from the first input INP via the first winding part W1, the second winding part W2, the closed first switch S1, the closed second switch S2 (or the single switch S12), the fourth winding part W4 and the third winding part W3 to the second input INN is formed, i.e., all the windings W1-W4 are coupled in series.

To accomplish that all windings are operable in both modes, the switch arrangement further comprises a fifth switch S5 connected between the one end of the first winding part W1 and the other end of the fourth winding part W4, and a sixth switch S6 connected between the one end of the third winding part W3 and the other end of the second winding part W2. The tunable inductor arrangement is thereby further tunable by closing the fifth and sixth switches S5, S6 when the third and fourth switches S3, S4 are closed. In that case, a circuit is formed from the first input INP via the closed fifth switch S5, the fourth winding part W4, the closed fourth switch S4, the closed third switch S3, the second winding part W2, and the closed sixth switch S6 to the second input INN.

Thereby, the tunable inductor arrangement is enabled to, by selectively provide for that a circuit comprising the first and fourth winding parts W1, W4 in parallel and the second and third winding part W2, W3 in parallel, and then couple the respective parallel couplings W1, W4; W2, W3 in series between the first and second inputs INP, INN, or a circuit comprising the first, second, fourth and third winding parts W1, W2, W4, W3 in series between the first and second inputs INP, INN, provide different inductances where all the windings are operable in both modes.

Although the above demonstrated tunable inductor arrangement can operate all windings in all its operating modes, it may still be combinable with additional inductor arrangements which does not. Such combinations may provide further tunability. To achieve a good Q-value, all winding parts with mutual magnetic interaction are preferably in operation at all states. One or more circuits as the one demonstrated above can be used as building blocks to achieve a tunable inductor arrangement.

Figure 2:
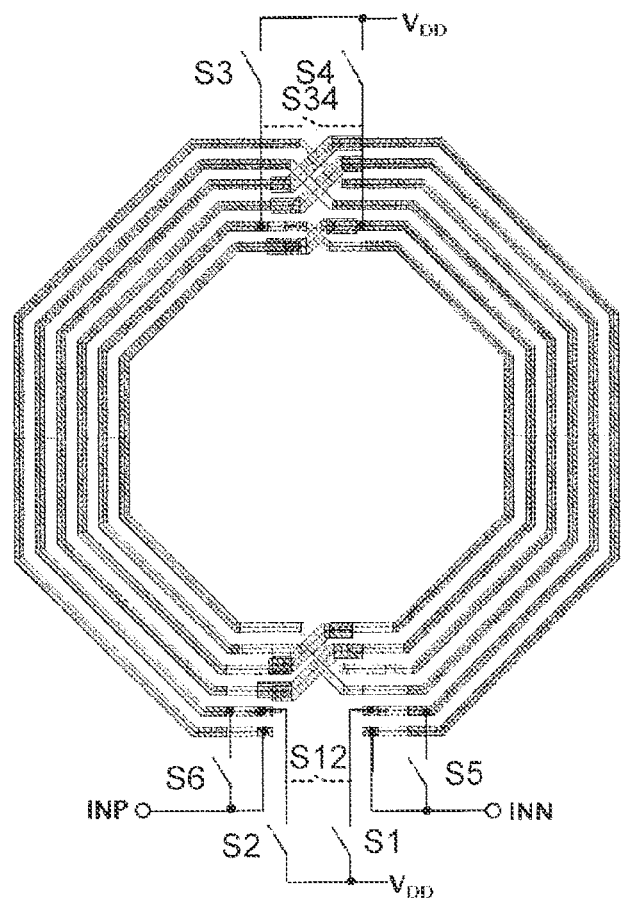
FIG. 2 illustrates a layout of windings of a tunable inductor arrangement together with a schematic indication on the switch arrangement according to an embodiment.

FIG. 2 illustrates a layout of windings of a tunable inductor arrangement together with a schematic indication on the switch arrangement according to an embodiment. The circuit corresponds to those demonstrated with reference to FIG. 1, and the function for providing different inductances is the same.

Figure 3:
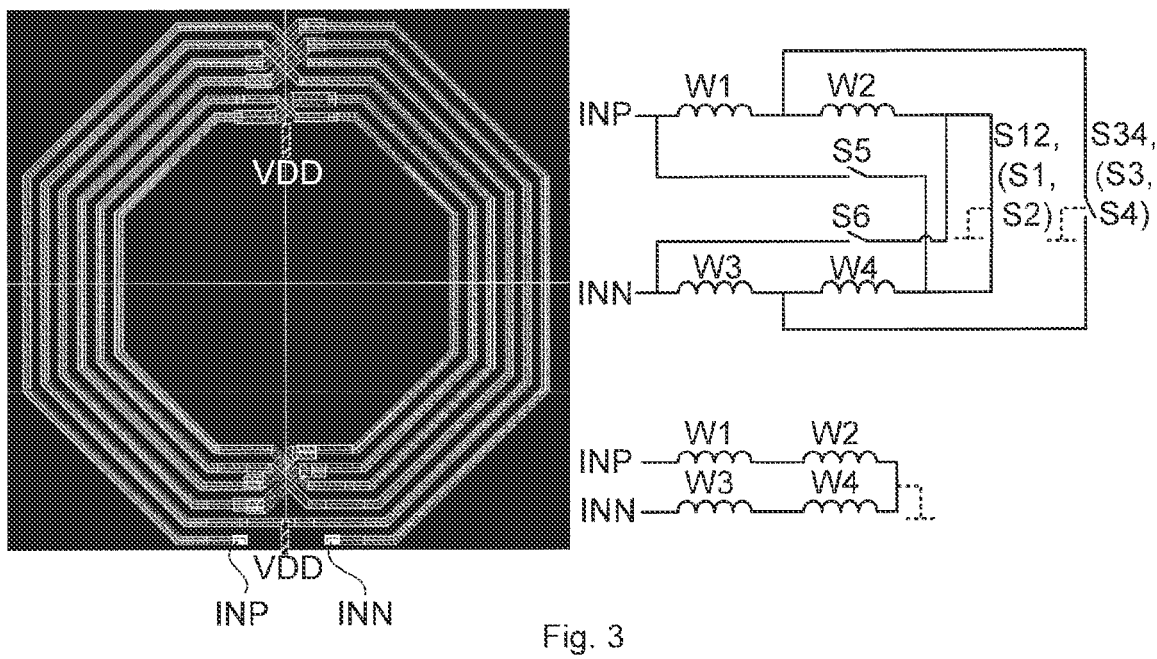
FIG. 3 illustrates a layout of windings of a tunable inductor arrangement when switches are in a first state, as illustrated in the corresponding schematic to the right, according to an embodiment.

FIG. 3 illustrates a layout of windings of a tunable inductor arrangement when switches are in a first state, as illustrated in the corresponding schematic to the upper right, according to an embodiment. At lower right, the equivalent circuit is drawn for simple understanding of the effect of the circuit. The circuit corresponds to the one achieved by having the single switch S12 (or the first and second switches S1 and S2) of FIGS. 1 and 2 closed and the other switches S34 (or S4, S4), S5, S6 open. Here, it can be seen that the series coupling provides a winding going from the terminal INP through all the conductive lanes and ending at the terminal INN.

The windings are arranged on a substrate or chip. The substrate can also be a printed circuit board. A virtual ground node can also be applied, which is also elucidated below with reference to FIG. 4. The virtual ground, which may be a DC power supply VDD, which at AC, such as radio frequency, acts as a ground for AC signals, or be a ground or DC reference voltage node, can be employed. When in the first state, the switch S12 (or S1, S2) connects the virtual ground node.

Figure 4:
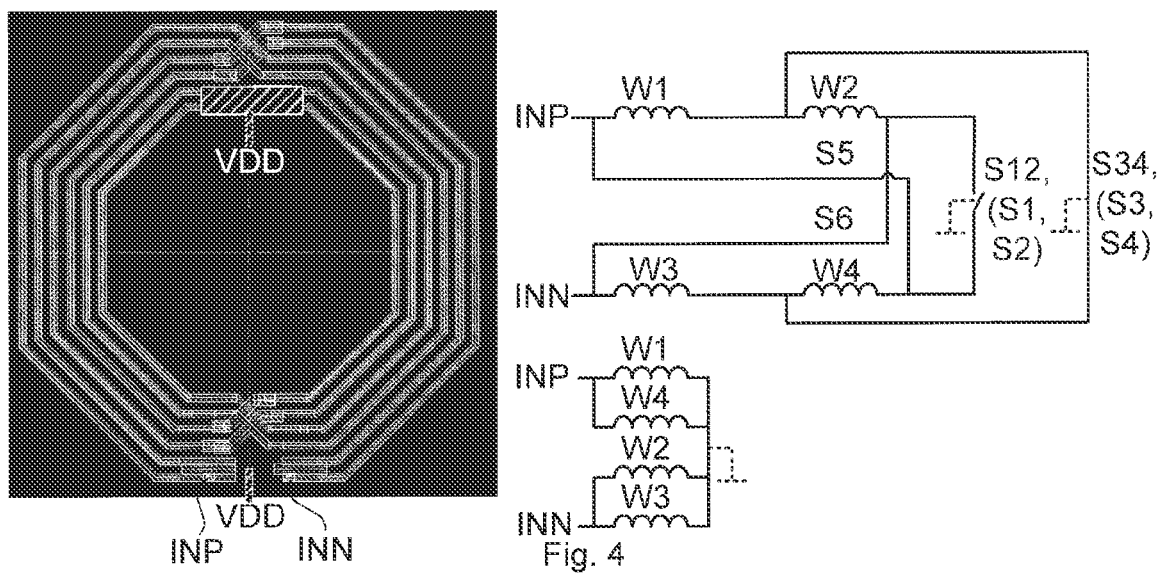
FIG. 4 illustrates a layout of windings of a tunable inductor arrangement when switches are in a second state, as illustrated in the corresponding schematic to the right, according to an embodiment.

FIG. 4 illustrates a layout of windings of a tunable inductor arrangement when switches are in a second state, as illustrated in the corresponding schematic to the upper right, according to an embodiment. At lower right, the equivalent circuit is drawn for simple understanding of the effect of the circuit. The circuit corresponds to the one achieved by having the single switch S12 (or the first and second switches S1 and S2) of FIGS. 1 and 2 open and the other switches closed. Here, it can be seen that a first parallel coupling starting from the terminal INP provides a winding going to meet a second parallel coupling at point A, which goes all the way to the terminal INN. At the coupling at point A, a virtual ground (not shown), such as power supply, can be connected. The virtual ground may be a DC power supply, which at AC, such as radio frequency, acts as a ground for AC signals, or be a ground or DC reference voltage node. When in the second state, the switch S34 (or S3, S4) connects the virtual ground node. As can be seen, when considering FIGS. 3 and 4, the virtual ground node cannot be employed as a single center tap in the layout of the windings as of FIGS. 3 and 4. However, for some layouts, i.e. where S12 (or S1, S2) and S34 (or S3, S4) are located adjacent to each other, which is depending on the number of turns and the application of the turns in multiple metal layers, the layout of the virtual ground node can be kept to one area of the substrate or chip.

Figure 5:
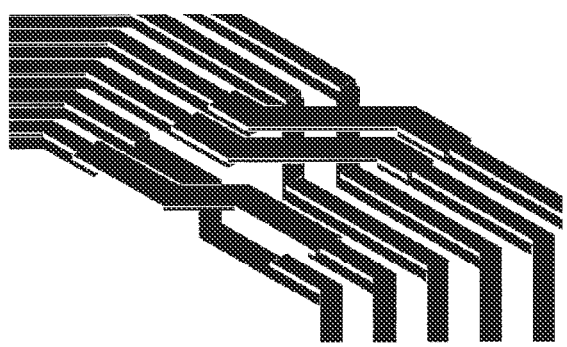
FIG. 5 illustrates a detail of a layout of windings of a tunable inductor arrangement according to an embodiment.

FIG. 5 illustrates a detail of a layout of windings of a tunable inductor arrangement according to an embodiment. Crossings of conductive lanes forming the windings can thus be achieved. Two or more of the winding parts can be arranged in a plurality of conductive layers on the chip or substrate. In the illustrations, the lanes are provided side by side on the substrate and the crossings using layered conductors. However, the lanes can also use layered conductors and be placed on top of each other, or a combination of be provided in different layers and side by side. The shape of the windings have also been illustrated as an octagon, but other shapes are as feasible, such as circular, square, or another n-sided shape, where n is 3 or higher, or combinations thereof, which form windings enclosing a magnetic field which is the purpose of the windings to form an inductance. The inductance can be adapted for differential purposes or single-ended purposes in a conventional way.

FIG. 6 schematically illustrates a radio front end where the tunable inductor arrangements according to embodiments are applicable. In a radio front end circuit used for example in a 3GPP LTE radio, a multitude of bands may be used. Further, if for example carrier aggregation where separate bands are collected and used simultaneously in different configurations, versatility is a key to a feasible front end solution. Still further, if the front end should be usable for other radio access technologies as well, such as GSM, UMTS, WLAN, GNSS, etc., the demands on versatility further increases. The received signal can thus be in a multitude of frequencies and having a wide or narrow bandwidth, and for example, a band selection filter, or another circuit that needs a resonator, may need to be configurable for this depending on current operating mode. Variable capacitance in such band selection filters normally do a lot, e.g., by using capacitor banks where capacitance can be switched in on demand, but by using a tunable inductor as demonstrated above, versatility can be improved, as well as the performance of circuits including resonators. For example, by using such resonators for band selection filters in multi-band receivers, the expanded tunability of the filters can make the band selection filter usable for any band of the multi-band receiver. By using one or more tunable inductor arrangements 602, 604 as those demonstrated above, the demands on versatility can be met. Flexible band combinations are thereby enabled.

An example where the front end arrangement as demonstrated above can be used is a multiband radio frequency receiver 600. The receiver 600 comprises a first receiver path arranged to receive a radio signal in a first frequency band and a second receiver path arranged to receive a radio signal in a second frequency band, wherein the first frequency band operates at a higher frequency than the second frequency band, i.e., a high-low band arrangement where both the high and the low bands can be received simultaneously. Each of the first and second receiver paths can be arranged to selectively operate at a selected frequency band among a plurality of frequency bands, e.g., the first high-band path can select to operate in one of 1800 MHz, 1900 MHz, 2100 MHz and 2700 MHz frequency bands while the second low-band path can select to operate in one of 750 MHz, 850 MHz, 900 MHz and 1500 MHz frequency bands simultaneously. These frequency bands are only demonstrated as examples, and other frequency bands and groupings between high and low-frequency bands are equally possible. Each receiver path comprises a resonator comprising a tunable inductor arrangement 602, 604 as demonstrated above, wherein the resonators are arranged to be tuned for the selected frequency band in respective receiver path. Arrangements with more than two such receiver paths are also possible. Flexible frequency band combinations are thus enabled, which for example is advantageous in carrier aggregation solutions since each filter can be enabled to cover any frequency within the total frequency range of the receiver 600 due to the improved tenability of the filters.

FIG. 6 illustrates an example where the resonator when used for tuning LNA output. The resonator with tunable inductor arrangement can, of course, be used for other purposes as well, such as for filters, impedance matching, etc., where a tunable inductance can be used.

FIG. 7 is a block diagram schematically illustrating communication device 700 according to an embodiment. The communication device comprises a receiver or transceiver 702, which can be connected to an antenna 704, and other circuits 706 such as a processor arranged to interact with the receiver or transceiver 702, input and output interfaces of the communication device 700, etc. The receiver or transceiver 702 comprises a resonator 710, wherein the resonator comprises one or more tunable inductor arrangements according to any one of embodiments demonstrated above. The tunable inductor arrangement is tunable to enable the resonator 710 to work at a plurality of resonating frequencies. The receiver or transceiver can also comprise a controller 708 which can be arranged to control the tuning of the resonator 710, i.e., also the tunable inductor arrangement. The receiver 702 can, for example, be the multiband radio frequency receiver 600 demonstrated with reference to FIG. 6.

FIG. 8 is a flow chart schematically illustrating a method of a tunable inductor arrangement according to an embodiment. The method comprises determining 801 a tuning setting for the tunable inductor arrangement. This can be made by receiving frequency allocation from a remote entity or from an entity within a communication apparatus having the tunable inductor arrangement. Based on for example the frequency allocation information switch states are assigned 802 for the switch or respective switches for the tuning setting and controlling 803 the switches according to the assigned switch states. Upon a new allocation, the procedure can be repeated.

The method according to the present invention is suitable for implementation with the aid of processing means, such as computers and/or processors, especially for the case where a digital controller controls the transceiver. Therefore, there is provided computer programs, comprising instructions arranged to cause the processing means, processor, or computer to perform the steps of any of the methods according to any of the embodiments described with reference to FIG. 8. The computer programs preferably comprise program code which is stored on a computer readable medium 900, as illustrated in FIG. 9, which can be loaded and executed by a processing means, processor or computer 902 to cause it to perform the methods, respectively, according to embodiments of the present invention, preferably as any of the embodiments described with reference to FIG. 8. The computer 902 and computer program product 900 can be arranged to execute the program code sequentially where actions of the any of the methods are performed stepwise. The processing means, processor, or computer 1002 is preferably what normally is referred to as an embedded system. Thus, the depicted computer readable medium 900 and computer 902 in FIG. 9 should be construed to be for illustrative purposes only to provide an understanding of the principle, and not to be construed as any direct illustration of the elements.

The invention has mainly been described above with reference to a few embodiments. However, as is readily appreciated by a person skilled in the art, other embodiments than the ones disclosed above are equally possible within the scope of the invention, as defined by the appended patent claims.

What is claimed is:

1. A substrate having a tunable inductor arrangement arranged thereon, the tunable inductor arrangement comprising:
a tunable inductor comprising:
a plurality of winding parts; and
a switch arrangement switchable between:
a first switch setting that interconnects the plurality of winding parts such that parallel groups of winding parts are connected in series between first and second inputs of the tunable inductor arrangement; and
a second switch setting that interconnects the plurality of winding parts in series between the first and second inputs.

2. The substrate of claim 1, wherein the parallel groups comprise a first parallel group of winding parts connected in series between the first and second inputs with a second parallel group of winding parts.

3. The substrate of claim 2, wherein the switch arrangement provides a virtual ground connection at the series connection between the first parallel group and the second parallel group.

4. A radio frequency transceiver comprising a resonator, wherein the resonator is arranged on the substrate of claim 1, and wherein the tunable inductor arrangement is tunable for changing the resonating frequency of the resonator.

5. The substrate of claim 1, wherein the substrate is a chip.

6. The substrate of claim 1, wherein the substrate is a printed circuit board.

7. The substrate of claim 1, wherein the plurality of winding parts comprises:
a first winding part connected at one end to the first input;
a second winding part connected at one end to the other end of the first winding part;
a third winding part connected at one end to the second input;
a fourth winding part connected at one end to the other end of the third winding part;
wherein the first, second, third and fourth winding parts are interleaved on the substrate such that magnetic fields of the windings are essentially common.

8. The substrate of claim 7, wherein the first switch setting interconnects the first and fourth winding parts in parallel and the second and third winding parts in parallel, with the parallel couplings connected in series between the first and second inputs, and wherein the second switch setting interconnects the first, second, fourth and third winding parts in series between the first and second inputs.

9. A communication device comprising:
a radio frequency transceiver that includes a substrate having a tunable inductor arrangement arranged thereon, for frequency tuning of the radio frequency transceiver, the tunable inductor arrangement comprising:
a plurality of winding parts; and
a switch arrangement switchable between:
a first switch setting that interconnects the plurality of winding parts such that parallel groups of winding parts are connected in series between first and second inputs of the tunable inductor arrangement; and a second switch setting that interconnects the plurality of winding parts in series between the first and second inputs.

10. The communication device of claim 9, wherein the radio frequency transceiver includes a multi-band radio frequency receiver, the multi-band radio frequency receiver comprising:
- a first receiver path arranged to receive a radio signal in a first frequency band;
- a second receiver path arranged to receive a radio signal in a second frequency band;
- wherein the first frequency band operates at a higher frequency than the second frequency band; and
- wherein each of the first and second receiver paths is arranged to selectively operate at a selected frequency band among a plurality of frequency bands, and wherein the tunable inductor arrangement is tuned for the selected frequency band.

\* \* \* \* \*

UNITED STATES PATENT AND TRADEMARK OFFICE
CERTIFICATE OF CORRECTION

PATENT NO. : 11,527,347 B2
APPLICATION NO. : 17/118212
DATED : December 13, 2022
INVENTOR(S) : Nilsson et al.

It is certified that error appears in the above-identified patent and that said Letters Patent is hereby corrected as shown below:

In the Specification

In Column 1, Line 8, delete "2019," and insert -- 2019, now U.S. Pat. No. 10,892,080, --, therefor.

In Column 5, Line 26, delete "S4, S4)," and insert -- S3, S4), --, therefor.

Signed and Sealed this
Thirteenth Day of June, 2023

Katherine Kelly Vidal
*Director of the United States Patent and Trademark Office*